US010347558B2

(12) United States Patent
Geissler et al.

(10) Patent No.: US 10,347,558 B2
(45) Date of Patent: Jul. 9, 2019

(54) LOW THERMAL RESISTANCE HANGING DIE PACKAGE

(71) Applicant: INTEL IP CORPORATION, Santa Clara, CA (US)

(72) Inventors: Christian Geissler, Teugn (DE); Georg Seidemann, Landshut (DE); Sonja Koller, Regensburg (DE); Jan Proschwitz, Riesa (DE)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 15/748,475

(22) PCT Filed: Aug. 31, 2015

(86) PCT No.: PCT/US2015/047819
§ 371 (c)(1),
(2) Date: Jan. 29, 2018

(87) PCT Pub. No.: WO2017/039630
PCT Pub. Date: Mar. 9, 2017

(65) Prior Publication Data
US 2018/0218962 A1    Aug. 2, 2018

(51) Int. Cl.
*H01L 23/00* (2006.01)
*H01L 25/065* (2006.01)
(Continued)

(52) U.S. Cl.
CPC ........ *H01L 23/3675* (2013.01); *H01L 21/563* (2013.01); *H01L 23/13* (2013.01);
(Continued)

(58) Field of Classification Search
CPC .............. H01L 25/043; H01L 25/0657; H01L 25/073–25/074
(Continued)

(56) References Cited

U.S. PATENT DOCUMENTS 6,154,370 A    11/2000  Degani et al.
2009/0079061 A1    3/2009  Mallik et al.
(Continued)

OTHER PUBLICATIONS

International Search Report and Written Opinion dated May 30, 2016 for International Application No. PCT/US2015/047819, 12 pages.

*Primary Examiner* — David Vu
*Assistant Examiner* — Brandon C Fox
(74) *Attorney, Agent, or Firm* — Schwabe, Williamson & Wyatt, P.C.

(57) ABSTRACT

Embodiments herein generally relate to the field of package assembly to facilitate thermal conductivity. A package may have a hanging die, and attach to a printed circuit board (PCB). The package may have an active side plane and an inactive side plane opposite the first active side plane. The package may also have a ball grid array (BGA) matrix having a height determined by a distance of a furthest point of the BGA matrix from the active side plane of the package. The package may have a hanging die attached to the active side plane of the package, the hanging die having a z-height greater than the BGA matrix height. When package is attached to the PCB, the hanging die may fit into an area on the PCB that is recessed or has been cut away, and a thermal conductive material may connect the hanging die and the PCB.

15 Claims, 15 Drawing Sheets

(51) Int. Cl.
| | |
|---|---|
| H01L 23/367 | (2006.01) |
| H01L 25/04 | (2014.01) |
| H01L 25/07 | (2006.01) |
| H01L 23/13 | (2006.01) |
| H01L 23/36 | (2006.01) |
| H01L 23/42 | (2006.01) |
| H01L 21/56 | (2006.01) |
| H01L 23/498 | (2006.01) |

(52) U.S. Cl.
CPC .............. *H01L 23/36* (2013.01); *H01L 23/42* (2013.01); *H01L 23/49838* (2013.01); *H01L 24/13* (2013.01); *H01L 24/16* (2013.01); *H01L 24/32* (2013.01); *H01L 24/33* (2013.01); *H01L 25/043* (2013.01); *H01L 25/0652* (2013.01); *H01L 25/0657* (2013.01); *H01L 25/073* (2013.01); *H01L 25/074* (2013.01); *H01L 23/49816* (2013.01); *H01L 23/49827* (2013.01); *H01L 2224/13024* (2013.01); *H01L 2224/16227* (2013.01); *H01L 2224/32141* (2013.01); *H01L 2224/32507* (2013.01); *H01L 2224/33519* (2013.01); *H01L 2924/15153* (2013.01)

(58) Field of Classification Search
USPC .......................................... 257/678, 712, 738
See application file for complete search history.

(56) References Cited

U.S. PATENT DOCUMENTS

| | | |
|---|---|---|
| 2009/0154124 A1 | 6/2009 | Ligander |
| 2010/0177490 A1 | 7/2010 | Gibbons et al. |
| 2011/0285005 A1* | 11/2011 | Lin ..................... H01L 21/4846 257/686 |
| 2014/0175636 A1 | 6/2014 | Roy et al. |
| 2014/0217610 A1* | 8/2014 | Jeng .................... H01L 23/3128 257/774 |
| 2015/0235993 A1* | 8/2015 | Cheng .................... H01L 25/50 257/712 |

* cited by examiner

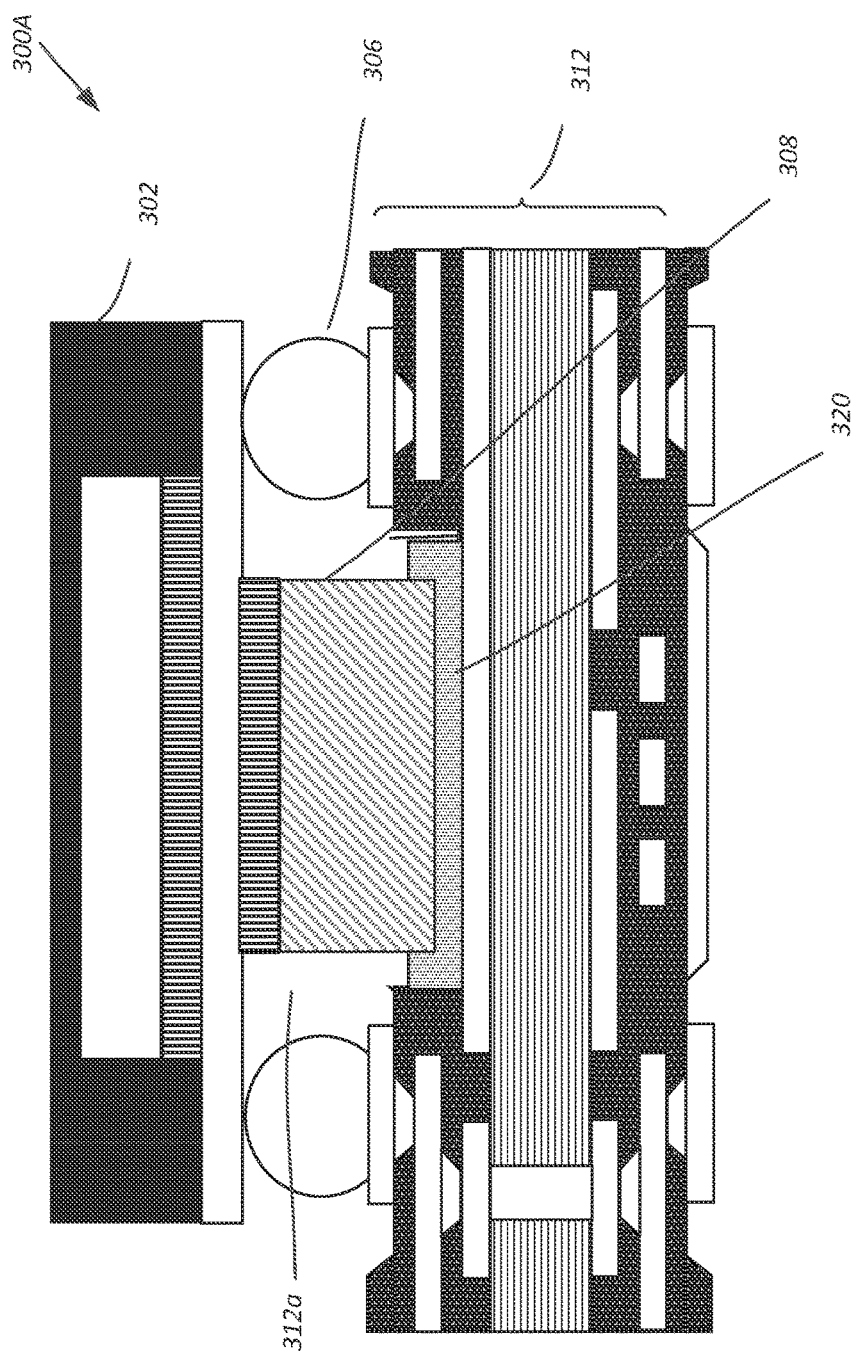

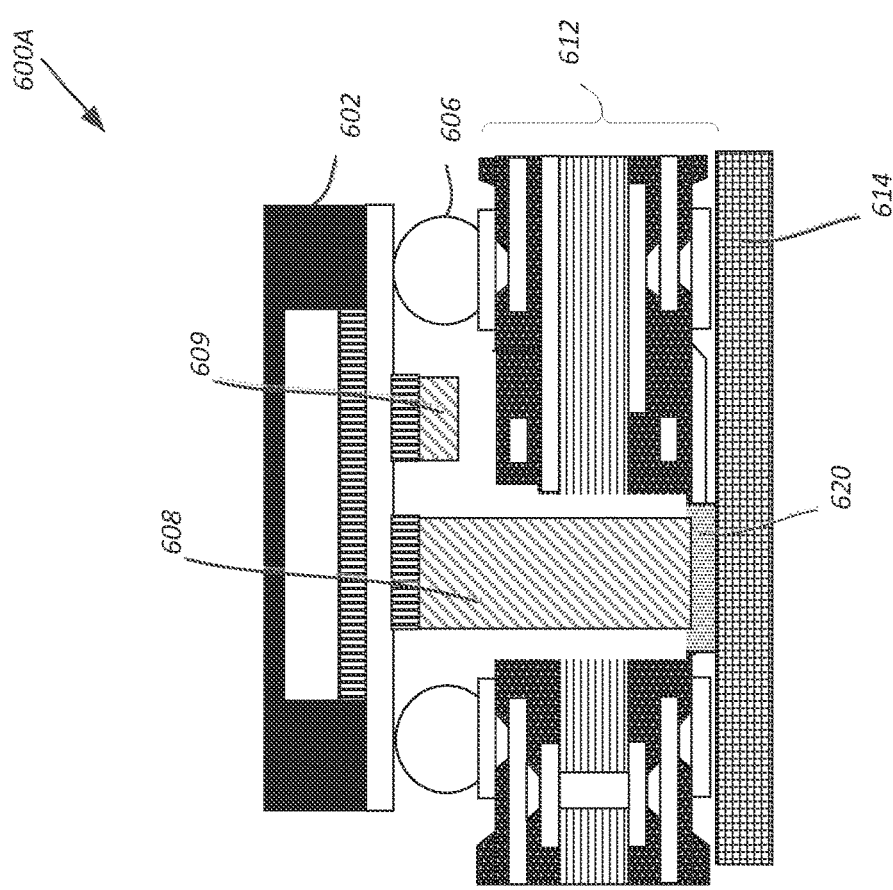

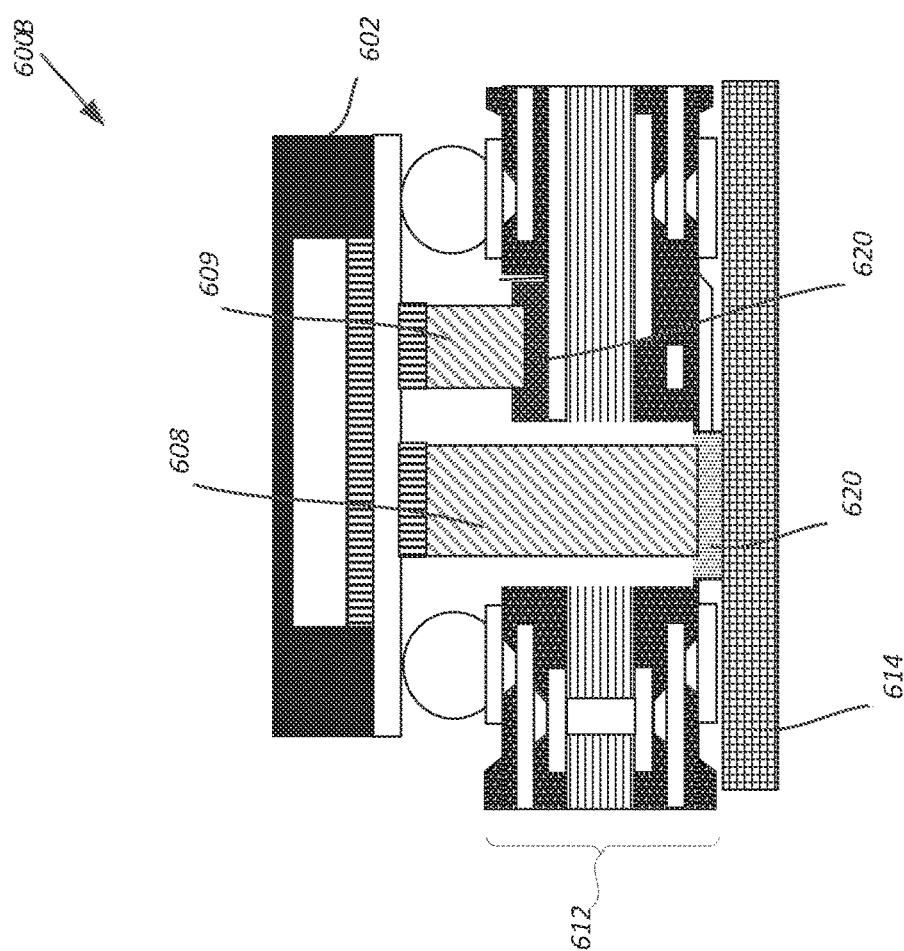

LOW THERMAL RESISTANCE HANGING DIE PACKAGE

CROSS REFERENCE TO RELATED APPLLCATIONS

This present application is a national phase entry under 35 U.S.C § 371 of International Application No. PCT/US2015/047819, filed Aug. 31, 2015, entitled "LOW THERMAL RESISTANCE HANGING DIE PACKAGGE", which designated, among the various States, The United Stated of America. The Specifications of the PCT/US2015/047819 Application is hereby incorporated by reference.

FIELD

Embodiments of the present disclosure generally relate to the field of package assemblies and, in particular, thermal dissipation in hanging dies.

BACKGROUND

Continuous form factor reduction is one major driver of package development for mobile, wearable and Internet-of-things (IoT) applications. A systems-in-package (SiP) approach is one solution to achieve a higher packing density, which may include the use of a hanging die.

BRIEF DESCRIPTION OF THE DRAWINGS

FIGS. 3A-3B illustrate examples of side views of package assemblies with a hanging die connected to a PCB, in accordance with some embodiments.

FIGS. 6A-6C illustrate examples of a package assembly with multiple hanging dies that may be connected to a PCB, in accordance with some embodiments.

DETAILED DESCRIPTION

Figure 1:
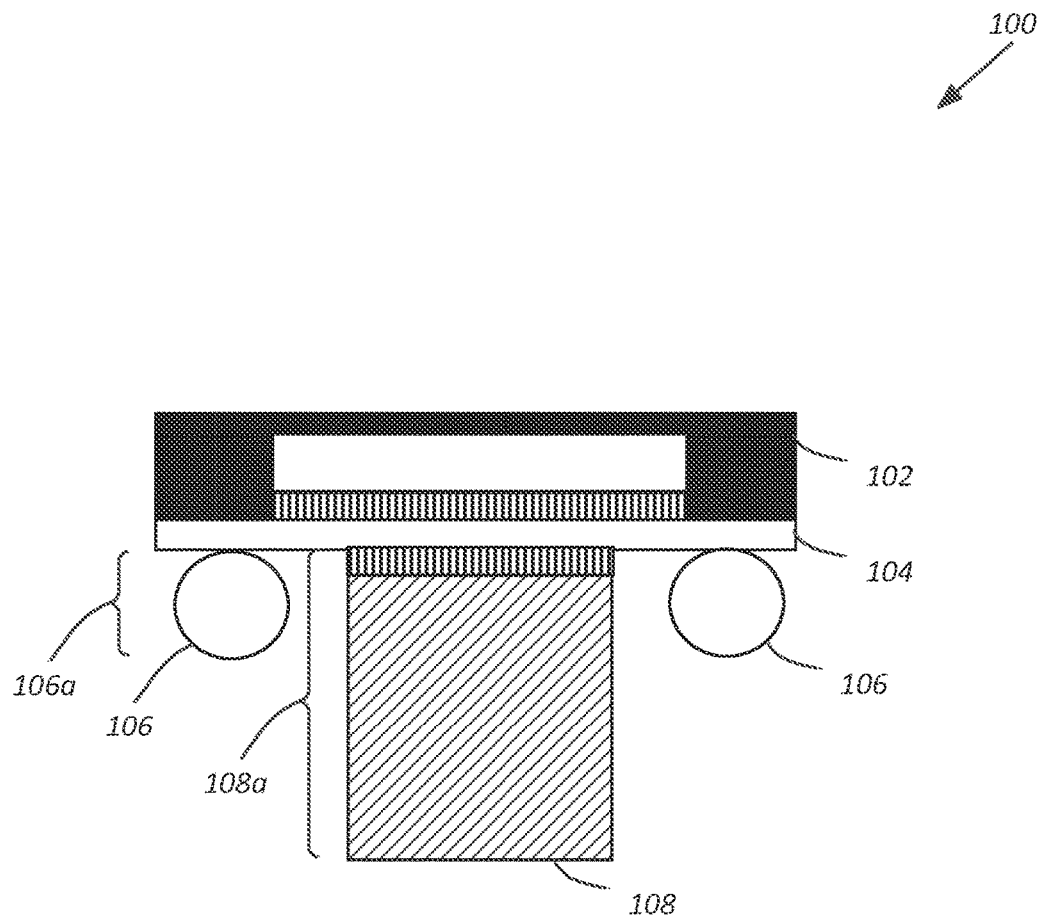
FIG. 1 illustrates an example of a package assembly with a hanging die, in accordance with some embodiments.

Embodiments of the present disclosure generally relate to the field of package assembly to facilitate thermal conductivity having a hanging die, and attaching the package assembly to a PCB. In embodiments, the package may have an active side plane and an inactive side plane opposite the first active side plane. The package may also have a ball grid array (BGA), matrix having a height determined by a distance of a furthest point of the BGA matrix from the active side plane of the package. The package may have a hanging die attached to the active side plane of the package, the hanging die having a z-height greater than the BGA matrix height. In embodiments, when the package is attached to the PCB, the hanging die fits into an area on the PCB that is recessed or has been cut away.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

In addition, Figures of various packages may be depicted in different configurations. In embodiments, one or more elements may be introduced in an earlier Figure, for example an element in FIG. 2A may then be assumed to carry over to later Figures found in 2B. In these and related situations, each and every element of the package assembly depicted in one Figure may not be labeled in each and every Figure for the sake of clarity and the ease of understanding.

As noted above, in legacy implementations of the SiP approach, in addition to the geometrical limitations and limitations regarding the number of inputs and outputs, the thermal aspect of the SiP is becoming a greater issue. In legacy implementations, a hanging die, which may refer to a die attached to the underside of a package, may be ground to a very low die thickness, for example between 50 and 100 micrometers (μm), to avoid issues such as the formations in opens or interconnects that may occur during the surface mount technology (SMT) process. In legacy implementations, hanging die thickness is typically smaller than the distance between the package and the PCB after the SMT process to avoid the hanging die touching the PCB.

In legacy systems, the main thermal dissipation path for a hotspot in a hanging die may include: lateral dissipation in the hanging silicon die, dependent upon thickness; the thermal connection between the hanging die and the package body; PCB metal or other layers to the adjacent balls in the BGA matrix in the PCB.

Thermal dissipation may be important for a number of reasons. Reduced silicon die thickness may reduce lateral thermal dissipation in the hanging die. In addition, the dissipation path may be longer than for a standard flip chip (FC) die attached on the top side of the substrate. The substrate may have the highest thermal resistance, and therefore may become a bottleneck in a thermal dissipation path.

In embodiments, a thermal resistance for a hanging die package construction may be significantly reduced by increasing the hanging die thickness significantly beyond the solder ball stand-off, by placing the hanging die over a PCB cavity or cut-out, and/or by connecting the hanging die backside thermally. For example, the hanging die backside may be thermally coupled with an inner thick metal layer of the PCB and/or a heat spreader on the PCB backside.

Advantages of the disclosed embodiments may be that lateral heat dissipation in the hanging die may be significantly improved by the larger hanging die thickness, which may mitigate temperature hot spots and may improve the thermal resistance path over the -substrate. In addition, a new vertical heat dissipation path through the hanging die may be created. In embodiments, the back side of a hanging die may be inserted into a PCB recess, cavity, cut-out, or hole, and the backside of a hanging die may be thermally connected to a heat spreader on the PCB backside. For example, the hanging die may be thermally connected to the heat spreader by using a heat conductive paste or, for larger cavity volumes, a gap pad may be used. Also, in embodiments with a PCB cavity, the backside of the hanging die may be thermally connected to an inner metal layer, or block, of the PCB, for example by using a heat conductive paste or a suitable thermally conductive underfill material. In embodiments, a nonconductive paste may be used, for example as in a process using a thermal compression nonconductive paste (TCNCP).

FIG. 1 depicts an example of a package assembly with a hanging die, in accordance with some embodiments. Package 100 may include a package body 102 that may be connected to a substrate or a redistribution layer (RDL) 104. In embodiments, the RDL 104 may include layers of conductive and dielectric material. The substrate or RDL layer 104 may facilitate connections for components within the package body 102 to BGA matrix solder balls 106. A hanging die 108 may be connected to the substrate or RDL layer 104. The hanging die 108 may have a height 108a from the substrate or RDL layer 104 that is greater than the distance of BGA balls 106 distance 106a from the substrate or RDL layer 104.

Figure 2A:
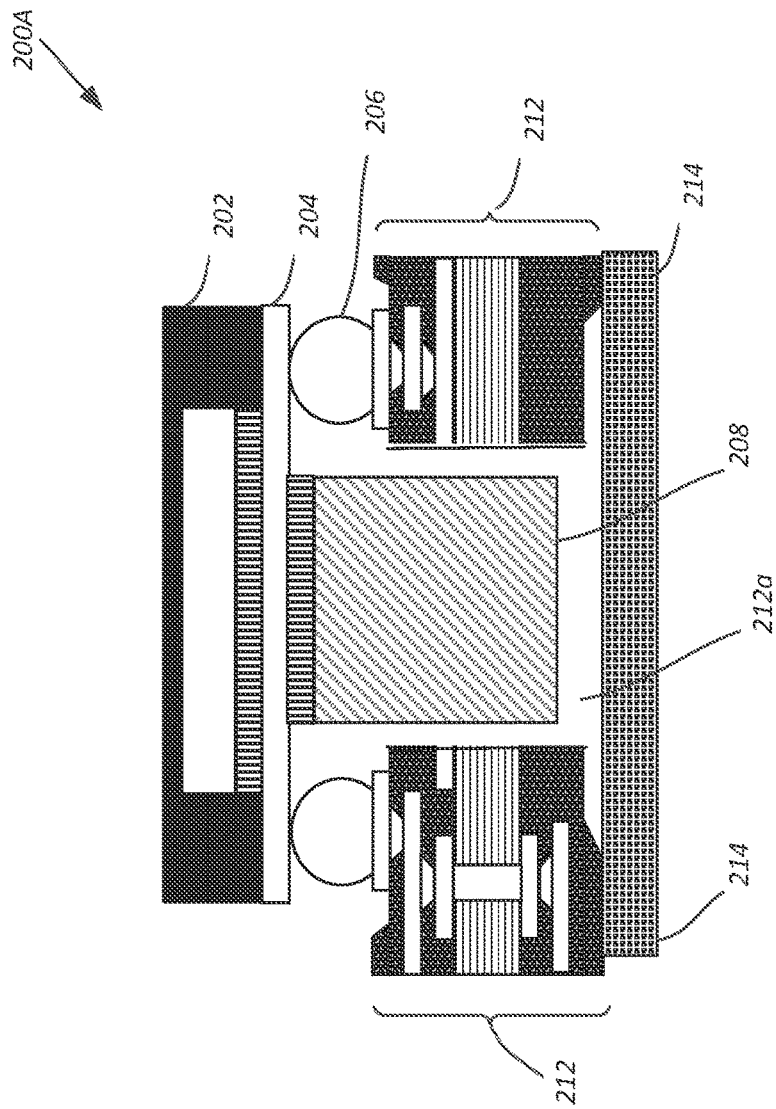
FIGS. 2A-2B illustrate examples of side views of package assemblies with a hanging die connected to a printed circuit board (PCB), in accordance with some embodiments.

FIG. 2A depicts an example of a package assembly with a hanging die, which may be connected to a PCB, in accordance with some embodiments. Diagram 200A may include package 202, which may be similar to package 102, BGA matrix solder balls 206 which may be similar to solder balls 106, and hanging die 208 which may be similar to hanging die 108. The package assembly 202 may be connected to a PCB 212. In embodiments, connections between the package 202 and the PCB 212 may be through connections at the matrix solder bails 206. The PCB 212 may include a heat spreader 214 connected to the PCB 212. In embodiments, these connections may allow thermal energy conductivity between thermally conductive areas of the PCB 212 and the heat spreader 214. In embodiments the PCB 212 may contain metallic layers or blocks that facilitate thermal transfer.

While for ease of understanding, embodiments may described with a PCB 212, in alternative embodiments, element 212 may be practiced with some other substrate for SMT.

In embodiments, the PCB 212 may have an open area 212a, which in non-limiting examples may be a cut-out or an open cavity in the PCB 212. In embodiments, when the package 202 may be attached to the PCB 212, the hanging die 208 may fit within the open area 212a. In embodiments, there may be space between the hanging die 208 and the edges of the open area 212a of PCB 212 and/or space between the hanging die 208 and the heat spreader 214.

Figure 2B:
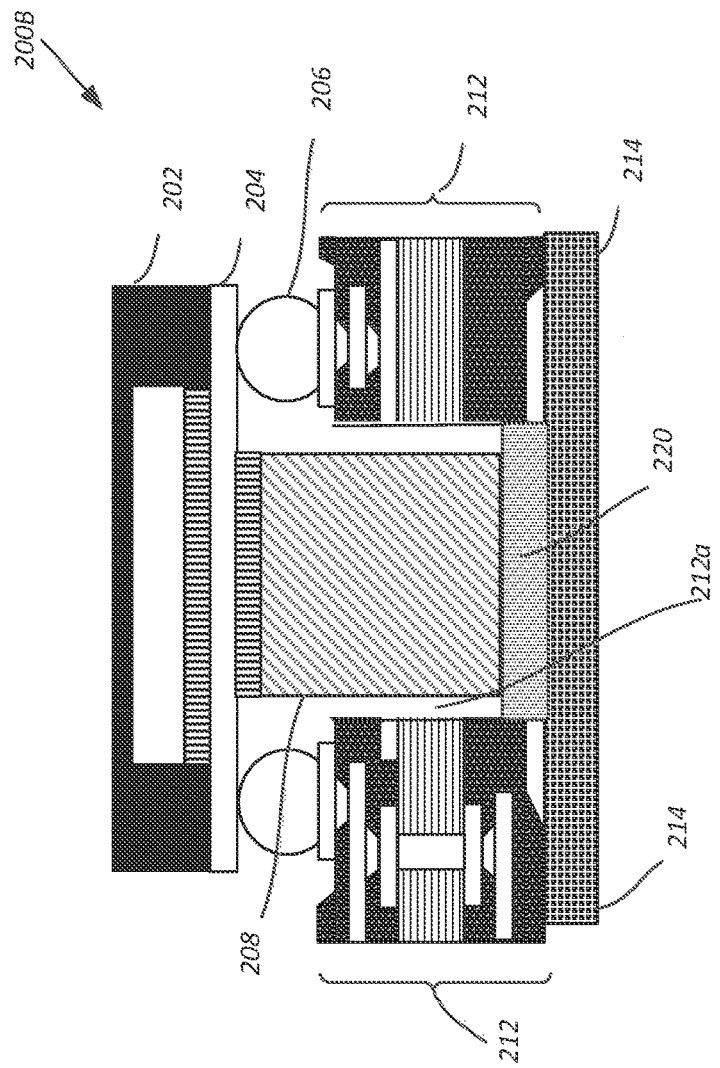

FIG. 2B depicts an example of the package assembly with a hanging die, which may be connected to a PCB, in accordance with some embodiments. In diagram 200B, package 202 may be connected to PCB 212 using solder balls 206. Hanging die 208 may fit within the open area 212a. In embodiments, a thermally conductive material 220 may be in contact with the hanging die 208, and an edge of the PCB 212 open area 212a and the heat spreader 214. In embodiments, this thermally conductive material 220, in non-limiting examples, may be a heat conductive paste, printed solder paste or a gap pad. In some embodiments, a heat spreader "nose" (not shown) that may be made of the same or similar material as heat spreader 214 may project up into the volume represented by the thermally conductive material 220, and may be used for larger cavity volumes. This nose may be formed as part of the heat spreader 214, or may be attached to the heat spreader 214 by a solder paste. In embodiments, solder paste may be directly printed from the PCB 212 backside into a PCB hole (not shown) followed by a reflow after a heat spreader fixation may have occurred. In addition, the bottom of the hanging die 208 may have a backside metallization layer with an intermetallic compound (IMC) phase that is grown (not shown) that is connected to the thermally conductive material 220. In embodiments, if there is additional backside metallization, the thermal contact between the hanging die and solder may be improved by forming an IMC-phase during reflow. In embodiments, solder can either be printed as solder paste or placed by one or more solder balls followed by a reflow process.

FIG. 3A depicts an example of a package assembly with a hanging die, which may be connected to a PCB, in accordance with some embodiments. In diagram 300, package 302, which may be similar to package 202, may be connected to a PCB 312, which may be similar to PCB 212, via a BGA matrix of solder balls 306, which may be similar to the BGA matrix of solder balls 206. When the package 302 is attached to the PCB 312, the hanging die 308, which may be similar to hanging die 208, may fit into the open PCB area 312a. In embodiments, the open area 312a may be an open cavity in the PCB 312. In embodiments, a thermally conductive material 320, which may be similar to thermally conductive material 220, may connect the hanging die 320 and the PCB 312. In embodiments, the thermally conductive material 220 may be connected to a metallic layer within the PCB 312.

Figure 3B:
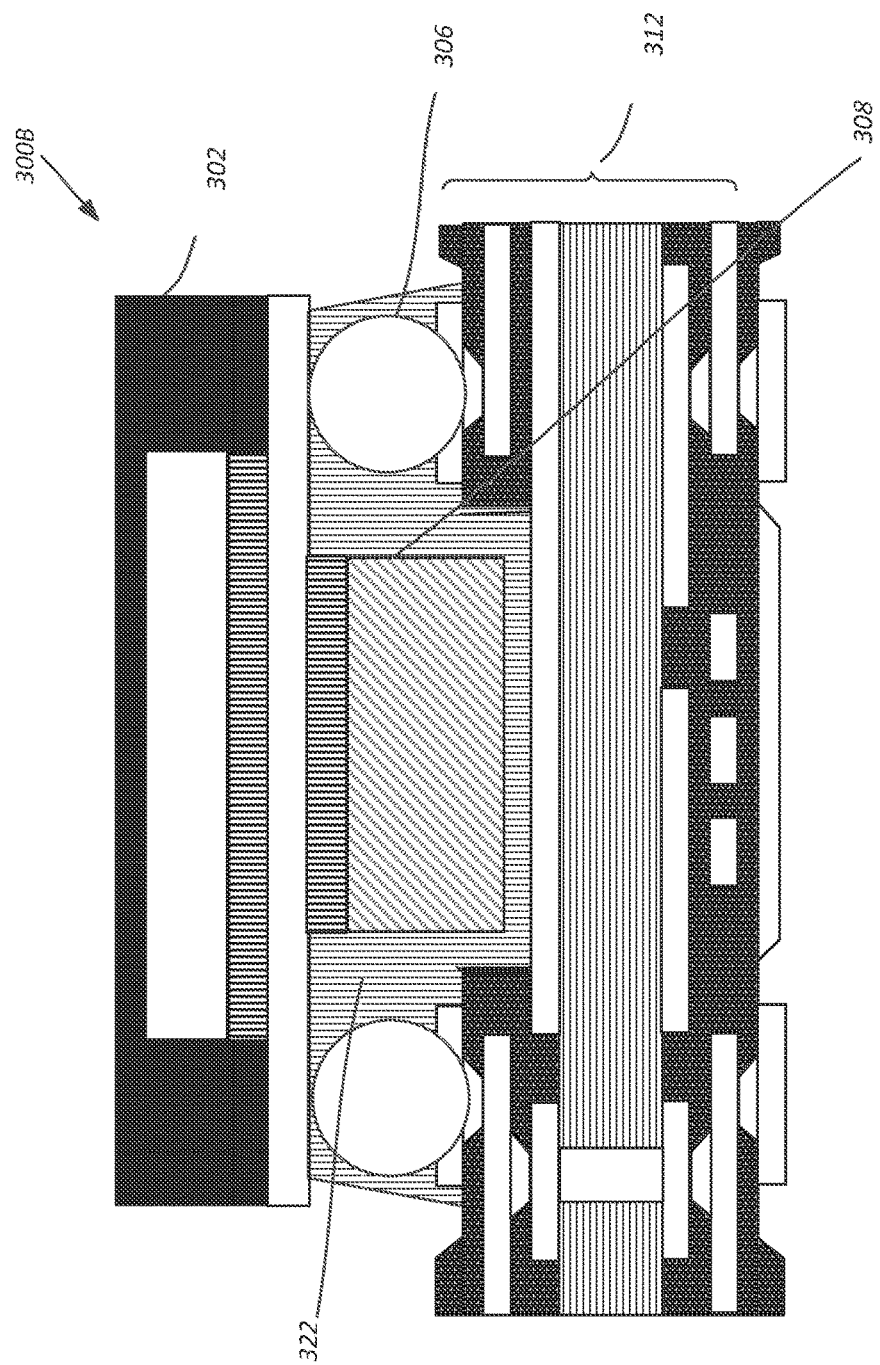

FIG. 3B depicts an example of a package assembly with a hanging die, which may be connected to a PCB, in accordance with some embodiments. In diagram 300B, package 302 may be connected to PCB 312 using a matrix of solder balls 306. When package 302 is attached to the PCB 312 the hanging die 308, a thermally conductive underfill material 322, may be used to fill the area to connect the hanging die 308 to the PCB 312. In embodiments, the underfill material 322 may come into contact with other portions of the package 302, may surround the matrix of solder balls 306, and/or may flow to other areas. In embodiments, the underfill material 322 may come into contact with one or more metallic layers within the PCB 312.

Figure 4A:
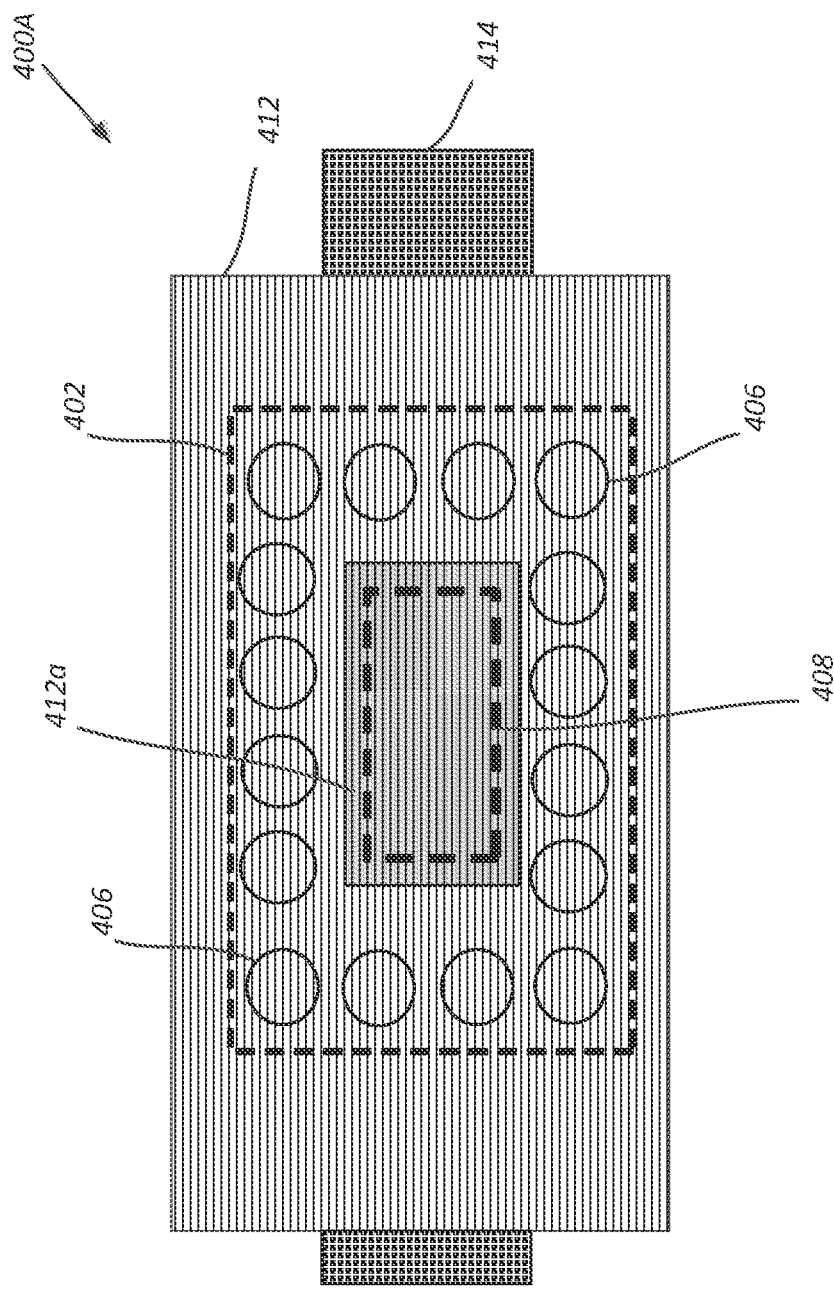
FIGS. 4A-4C illustrate top views of examples of package assemblies with a hanging die connected to a PCB, in accordance with some embodiments.
Figure 4B:
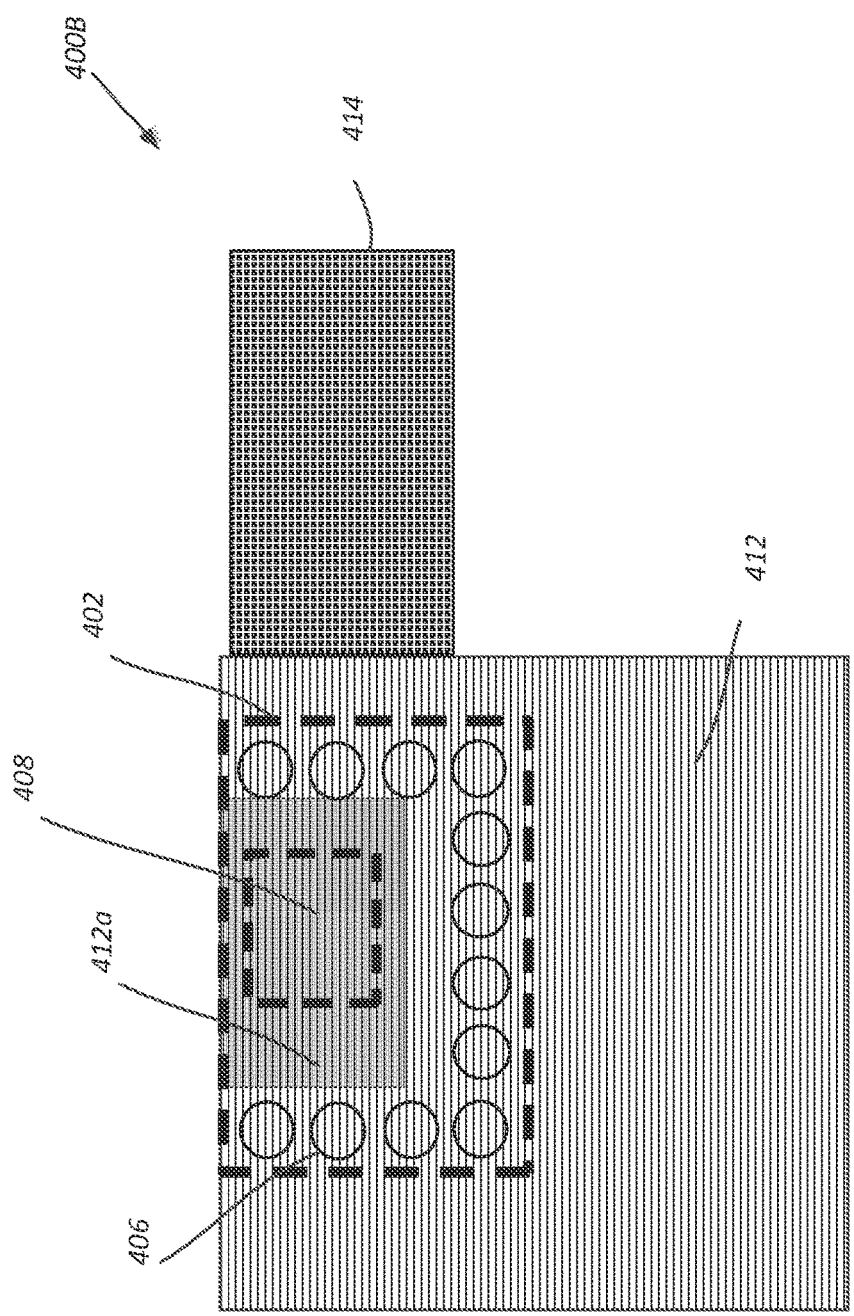
Figure 4C:
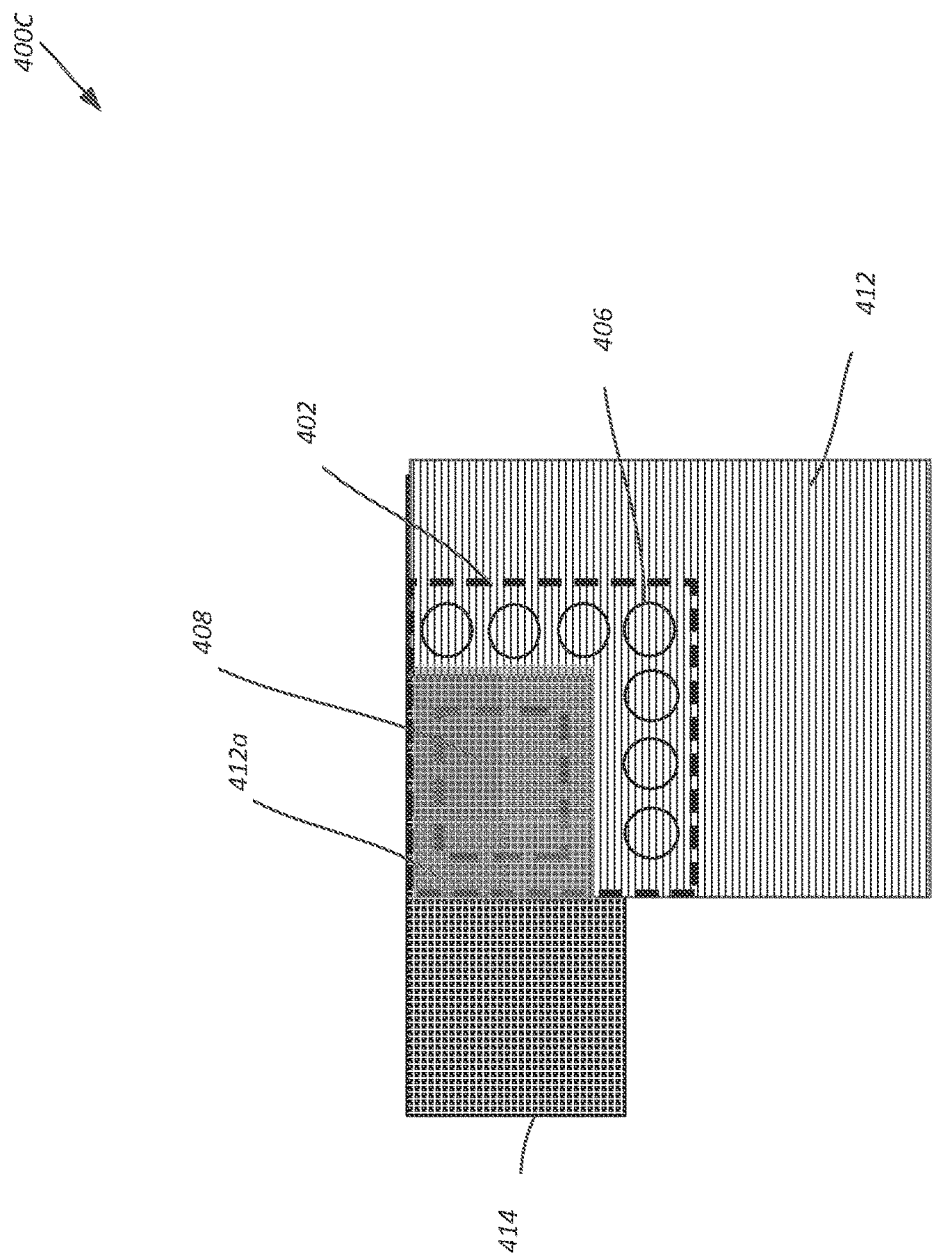

FIGS. 4A-4C depict examples of top views of package assemblies with a hanging die, that are connected to a PCB in various locations, in accordance with some embodiments.

FIG. 4A shows diagram 400A, wherein a package 402, which may be similar to package 202, may be located within an area of a PCB 412, which may be similar to PCB 212, and may be connected with solder balls 406, which may be similar to solder balls 206. A hanging die 408, which may be similar to hanging die 208, may be partially situated within an open area 412a within PCB 412. In embodiments, the open area 412a may be surrounded by the PCB 412. In embodiments, the hanging die 408, and/or the PCB 412 may be connected to a heat spreader 414.

FIG. 4B shows diagram 400B, wherein a package 402 may be located within an area of PCB 412, and may be connected with solder balls 406. A hanging die 408 may be partially situated within an open area 412 a within PCB 412. In embodiments, the hanging die 406 or the PCB 412 may be connected to a heat spreader 414. In embodiments, the open area 412a may be at an edge of the PCB 412, and may form a U-shape. In embodiments, the matrix of solder balls 406 may form a U-shape array to connect to the PCB 412.

FIG. 4C shows diagram 400C, wherein a package 402 may be located within an area of PCB 412, and may be connected with a matrix of solder bails 406. A hanging die 408 may be partially situated within an open area 412a at a corner of PCB 412. In embodiments, the hanging die 406 or the PCB 412 may be connected to a heat spreader 414. In embodiments, the open area 412a may be at a corner of the PCB 412. In embodiments, the matrix of solder balls 406 may form an L-shape array to connect to the PCB 412.

Figure 5A:
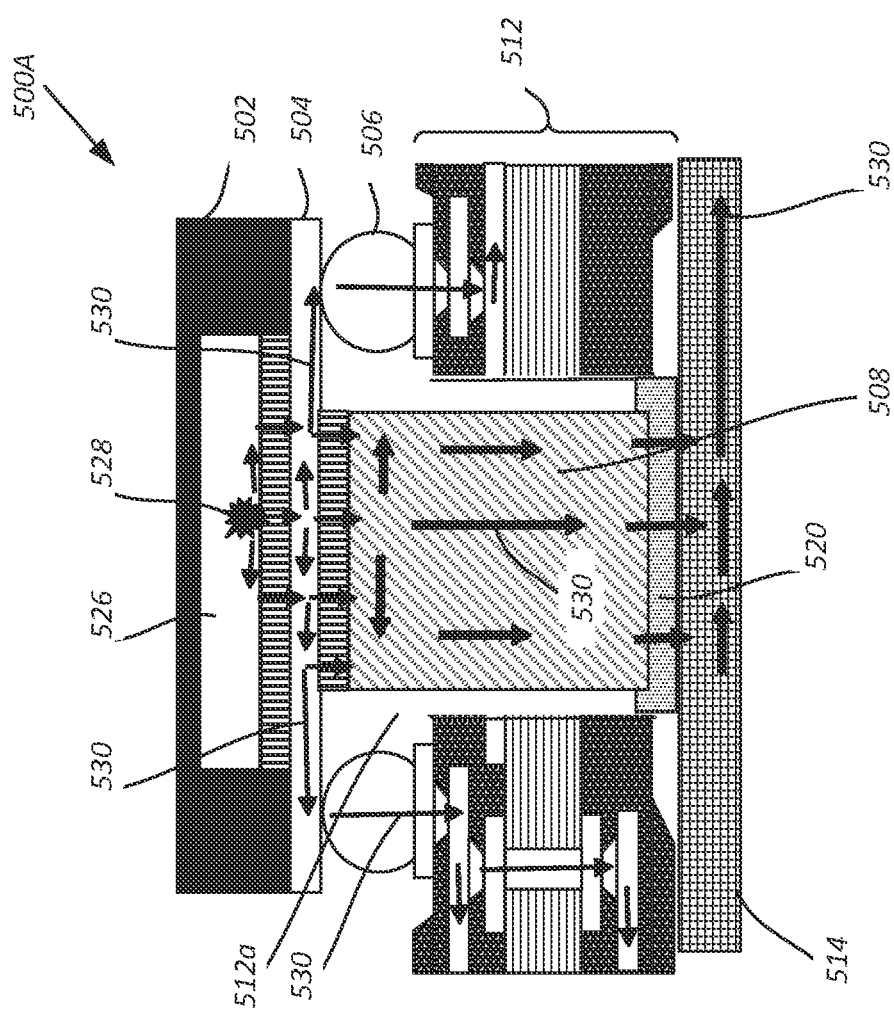
FIGS. 5A-5B illustrate examples of heat dissipation within a package assembly with a hanging die connected to a PCB, in accordance with some embodiments.
Figure 5B:
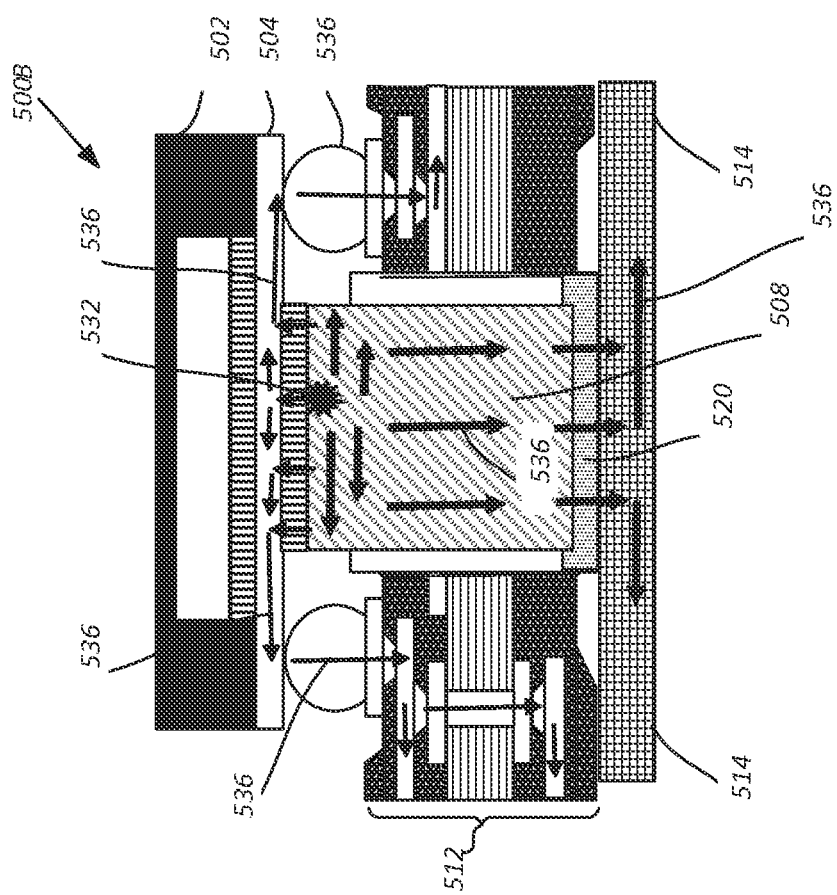

FIGS. 5A through 5B illustrate examples of heat dissipation of a package assembly with a hanging die connected to a PCB, in accordance with some embodiments, FIG. 5A shows diagram 500A that may include a package 502, which may be similar to package 202 that may be connected to a PCB 512, which may be similar to PCB 212. The package at 502 may be connected to the PCB 512 by a matrix of solder balls 506, which may be similar to solder balls 206. In embodiments, PCB 512 may contain an open area 512a, which may be similar to open area 212a, into which part of hanging die 508, which may be similar to hanging die 208, may be inserted. A thermally conductive material 520, which may be similar to thermally conductive material 220, may connect the hanging die 508 with the heat spreader 514, which may be similar to heat spreader 214.

In embodiments, during operation of the PCB 512 and/or the package 502, a thermal hotspot 528 may occur within a non-hanging die 526. The arrows 530 within the diagram 500A, may show example thermal conductive flows from the hotspot 528. In embodiments, the thermal flow may go from hotspot 528 through the substrate or RDL 504. From there, the thermal energy flow may proceed to the matrix of solder balls 506, or flow into hanging die 508. From hanging die 508, the thermal energy flow may proceed through the thermally conductive material 520 and to the heat spreader 514. From the matrix of solder balls 506, the thermal energy may flow through metal layers within the PCB 512, and may flow through PCB dielectric material to the heat spreader 514.

FIG. 5B shows diagram 500B that may include elements similar to diagram 500A. In embodiments, there may be a hotspot 532 in the hanging die 508. The arrows 536 within the diagram 500B may show example thermal conductive flows from the hotspot 532. In embodiments, thermal energy flow may travel from the hotspot 532 up to the substrate or RDL 504, down through solder balls 506, and into the PCB 512, which may contain one or more metallic layers to dissipate thermal energy, which may flow through PCB dielectric material to the heat spreader 514. In embodiments, the thermal conductive flows from the hotspot 532 may include thermal flows through the hanging die 508, through a thermally conductive material 220 that may connect the hanging die 508 with a heat spreader 514, and to the heat spreader 514.

Figure 6C:
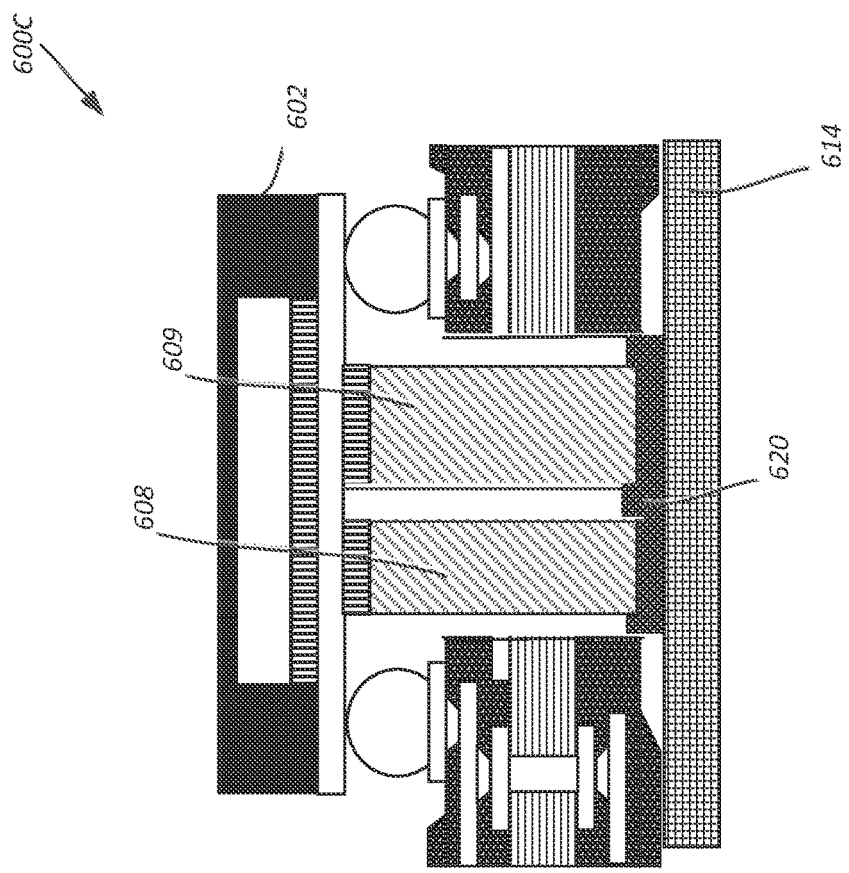

FIGS. 6A-6C illustrate examples of a package assembly with multiple hanging dies that may be connected to a PCB, in accordance with some embodiments. FIG. 6A shows diagram 600A that may include elements similar to diagram 200A. In embodiments, package 602, which may be similar to package 202, may have a first hanging die 608 and a second hanging die 609 connected to the package 602. In embodiments, the first hanging die 608 may be connected to a thermal conductive material 620, which may be similar to thermal conductive material 220. The thermal conductive material 620 may be connected to the PCB 612, which in embodiments may be similar to PCB 212, and/or to the heat spreader 614, which may be similar to heat spreader 214. The second hanging die 609 may not be connected to PCB 612 or the heat spreader 614.

FIG. 6B shows diagram 600B that may include elements similar to diagram 600A. Here, the second hanging die 609 may be connected to the PCB 612 by a thermally conductive material 620.

FIG. 6C shows diagram 600C that may include elements similar to diagram 600A. The second hanging die 609 may be connected by thermal conductive layer 620 to heat spreader 614. In embodiments, the first hanging die 608 and the second hanging die 609 may have different thicknesses, or may be of the same thickness. In embodiments, the first hanging die 608 and the second hanging die 609 may share the same thermal conductive layer 620, which may be connected to the PCB 612.

Figure 7:
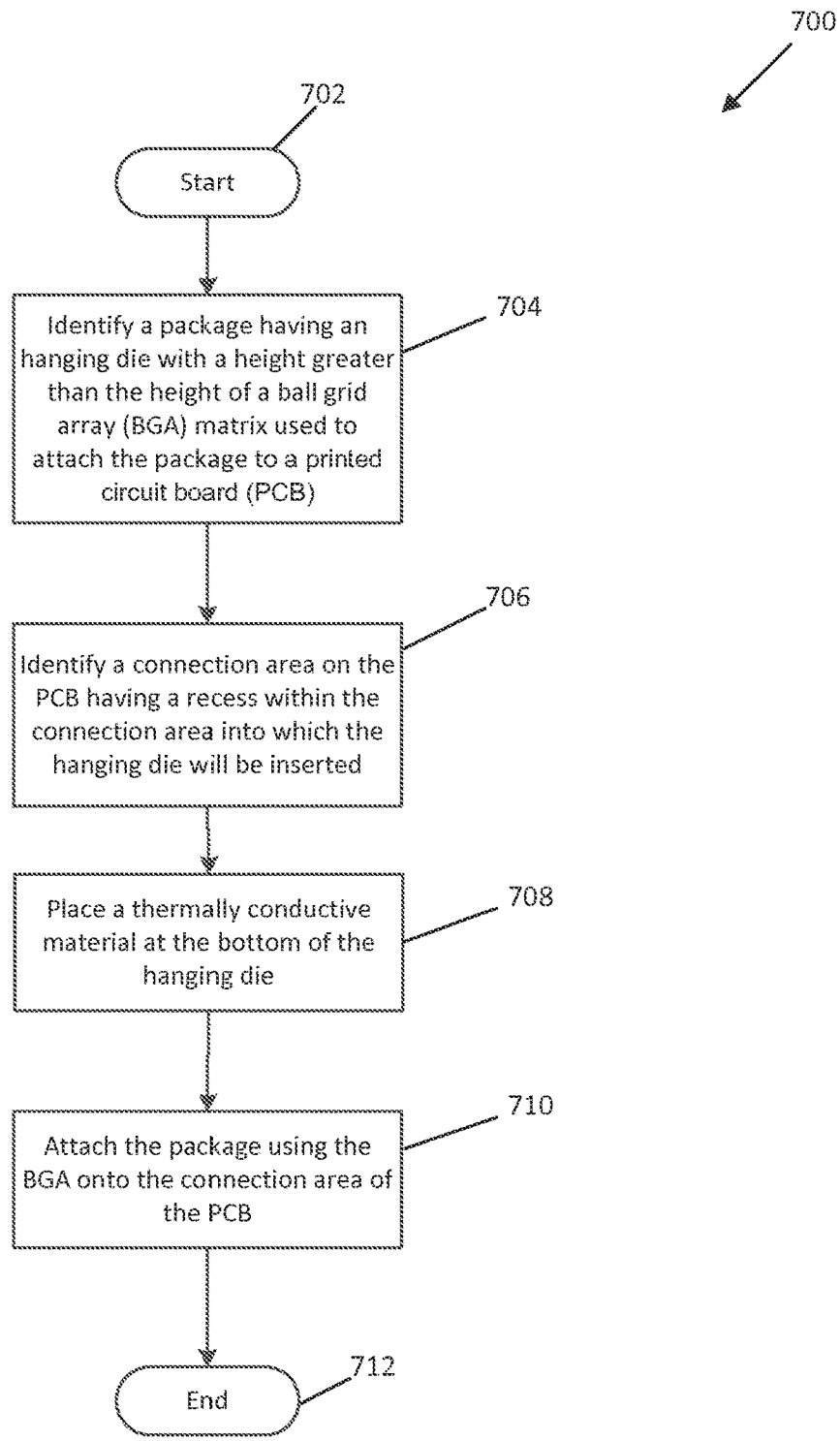
FIG. 7 illustrates an example process for manufacturing a PCB connected to a package assembly having a hanging die, in accordance with embodiments.

FIG. 7 illustrates a flow diagram showing a method 700 of manufacturing a PCB, such as PCB 212, connected to a package assembly, such as package assembly 202, having a hanging die, such as hanging die 208, in accordance with embodiments. The method 700 may start at block 702.

At block 704, a package, such as package 202, may be identified having hanging die, such as hanging die 208 with a height, such as height 108a, greater than the height of a BGA matrix, such as BGA matrix height 106a.

At block 706, a connection area, such as the connection area defined by the package 402 may be identified on the PCB, such as PCB 412, having a recess, such as recess 412a within the connection area into which the hanging die, such as hanging die 408, may be inserted.

At block 708, a thermally conductive material, such as thermally conductive material 320, may be placed at the bottom of the hanging die. The thermally conductive material may be connected to the PCB 312.

At block 710, the package, such as package 112, may be attached using the BGA matrix, such as BGA matrix that includes solder balls 406, onto the connection area of the PCB, such as the connection area defined by the package 402.

At block 712, the method 700 may end.

Figure 8:
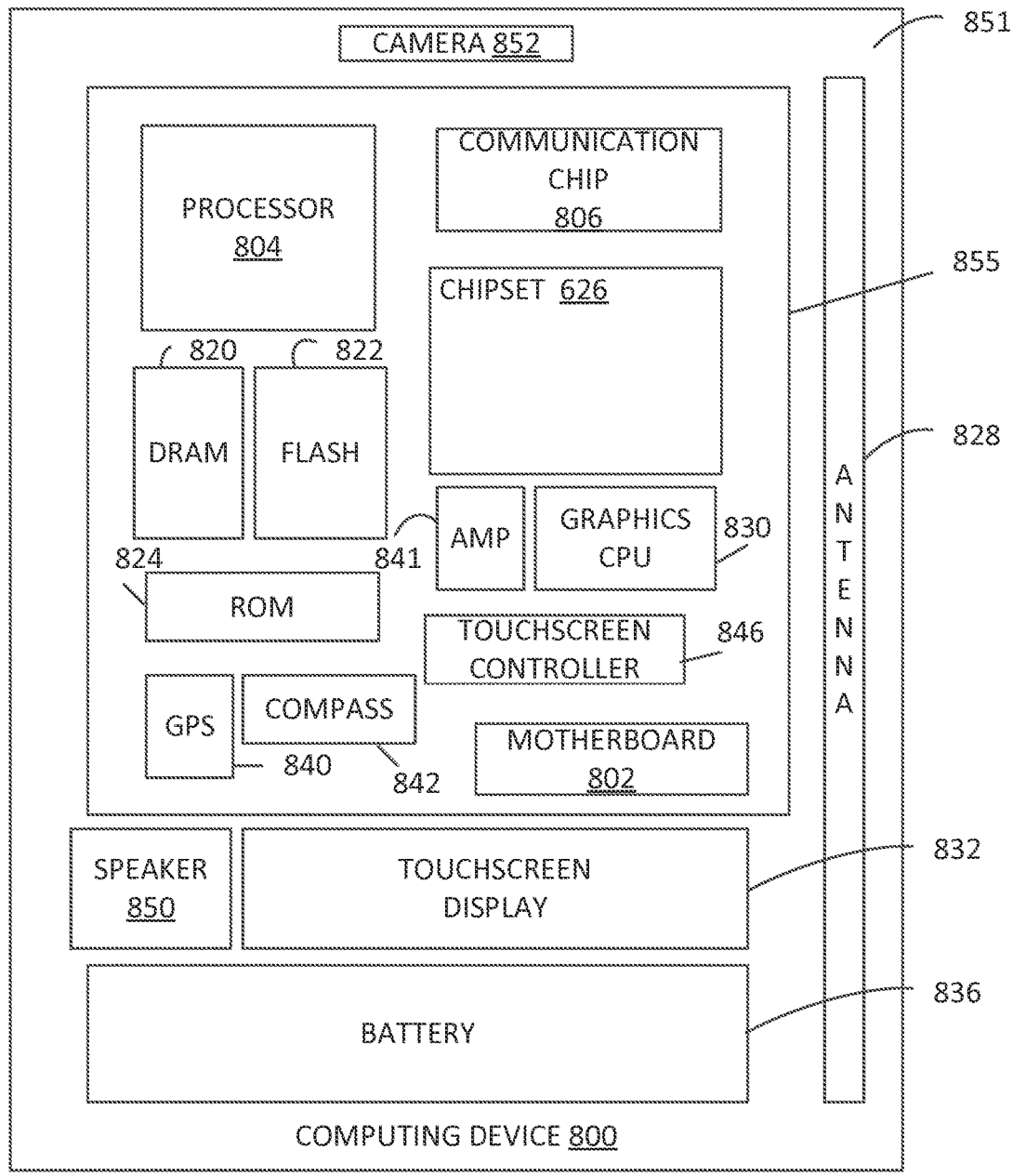
FIG. 8 schematically illustrates a computing device, in accordance with embodiments.

Embodiments of the present disclosure may be implemented into a system using any suitable hardware and/or software to configure as desired. FIG. 8 schematically illustrates a computing device 800 in accordance with one implementation of the invention. The computing device 800 may house a board such as motherboard 502 (i.e. housing 851). The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM) 820, non-volatile memory (e.g., ROM) 824, flash memory 822, a graphics processor 830, a digital signal processor (not shown), a crypto processor (not shown), a chipset 826, an antenna 828, a display (not shown), a touchscreen display 832, a touchscreen controller 846, a battery 836, an audio codec (not shown), a video codec (not shown), a power amplifier 841, a global positioning system (GPS) device 840, a compass 842, an accelerometer (not shown), a gyroscope (not shown), a speaker 850, a camera 852, and a mass storage device (such as hard disk drive, compact disk (CD), digital versatile disk (DVD), and so forth) (not shown). Further components, not shown in FIG. 8, may include a microphone, a filter, an oscillator, a pressure sensor, or an RFID chip. In embodiments, one or more of the package assembly components 855 may be a package assembly such as package assembly 100 shown in FIG. 1, package assemblies 200A, 200B shown in FIG. 2, or package assemblies 300A, 300B shown in FIG. 3.

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others. In some embodiments, one or more of the communication chips may include a die in a package assembly such as, for example, one of package assemblies 100, 200A, 200B, 300A, 300B described herein.

The processor 806 of the computing device 800 may include a die in a package assembly such as, for example, one of package assemblies 100, 200A, 200B, 300A, 300B described herein. The term "processor" may refer to any device or portion of a device that processes electronic data from registers and/or memory to transform that electronic data into other electronic data that may be stored in registers and/or memory.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data, for example an all-in-one device such as an all-in-one fax or printing device.

EXAMPLES

Example 1 is a package comprising: an active side plane and an inactive side plane opposite the first active side plane, the active and inactive side planes being parallel to each other; a ball grid array, BGA, matrix electrically coupled to the active side of the package, the BGA matrix having a height determined by a distance of a furthest point of the BGA matrix to the active side plane of the package; a hanging die attached to the active side plane of the package, the hanging die having a z-height greater than the BGA matrix height.

Example 2 may include the subject matter of Example 1, further comprising a substrate having an active side plane attached to and electrically coupled to the BGA matrix.

Example 3 may include the subject matter of Example 1, wherein a second die is molded into the package.

Example 4 may include the subject matter of Example 1, wherein the hanging die is electrically coupled to and parallel to the active side plane of the package.

Example 5 may include the subject matter of Example 4, wherein the hanging die is a combination of multiple hanging dies.

Example 6 may include the subject matter of Example 2, wherein the active side of the package, the active side of the hanging die, and the active side of the substrate are generally parallel to each other in a first direction x and a second direction y perpendicular to the first direction x, and having a respective z-height measurement in a third direction perpendicular to the first direction and the second direction; wherein the substrate includes a substrate recess beginning at the first active side plane of the substrate and continuing into a body of the substrate; and wherein, when the package is coupled to the substrate, the hanging die is positioned within all or part of the substrate recess.

Example 7 may include the subject matter of Example 6, wherein the hanging die does not come into contact with the substrate when the package is coupled with the substrate.

Example 8 may include the subject matter of Example 6, wherein at least part of the hanging die is tangent to the substrate when the package is coupled with the substrate.

Example 9 may include the subject matter of Example 6, wherein a material to dissipate heat directly connects at least part of the hanging die portion positioned within all or part of the substrate recess to at least part of the substrate, when the package is coupled with the substrate.

Example 10 may include the subject matter of Example 9, wherein a heat spreader is attached to the opposite substrate side; and wherein the heat spreader is directly connected to the material to dissipate heat.

Example 11 may include the subject matter of Example 9, wherein the material to dissipate heat is one or more of a heat conductive paste, a gap pad, a heat spreader nose, or printed solder paste.

Example 12 may include the subject matter of Example 9, wherein the material to dissipate heat further includes an intermetallic compound.

Example 13 may include the subject matter of Example 6, wherein the substrate is a PCB, and the recess in the substrate is a PCB cutout.

Example 14 may include the subject matter of Example 6, wherein the hanging die is connected to the substrate with underfill material.

Example 15 is a system with a package assembly, the system comprising: a printed circuit board, PCB; a package assembly coupled with the circuit board, the package assembly comprising: a package having an active side plane and an inactive side plane opposite the first active side plane, the active and inactive side planes being parallel to each other; a ball grid array, BGA, matrix electrically coupled to the active side of the package, the BGA matrix having a height determined by the distance of the furthest point of the BGA matrix from the active side plane; a hanging die coupled to the active side plane of the package, the hanging die having a z-height greater than the BGA matrix height.

Example 16 may include the subject matter of Example 15, wherein the PCB further includes: an active side plane; a connection area on the active side plane where the BGA matrix of the package connects; a recess within the connection area having dimensions sufficient for the hanging die to fit into when the package is attached to the PCB.

Example 17 may include the subject matter of Example 16, wherein the PCB further includes: a thermally conductive material in contact with the hanging die and the PCB.

Example 18 may include the subject matter of Example 16, wherein the PCB further includes; a heat spreader that is connected to the backside of the PCB that is not the active side plane; a thermally conductive material that connects the hanging die to the heat spreader.

Example 19 may include the subject matter of Example 16, wherein the PCB further includes one or more thermally conductive metallic layers connected to the hanging die using thermally conductive material.

Example 20 may include the subject matter of Example 16, wherein the thermally conductive material is a gap pad, heat dissipation paste, or printed solder paste.

Various embodiments may include any suitable combination of the above-described embodiments including alternative (or) embodiments of embodiments that are described in conjunctive form (and) above the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A package comprising:
   a ball grid array, BGA, matrix electrically coupled to an active side plane of the package, the BGA matrix having a height determined by a distance of a farthest point of the BGA matrix to the active side plane;
   a hanging die attached to the active side plane of the package;
   a substrate having an active side plane attached to and electrically coupled to the BGA matrix, wherein the substrate includes a substrate recess beginning at the first active side plane of the substrate and continuing into a body of the substrate;
   wherein the active side plane of the package, an active side of the hanging die, and the active side plane of the substrate are generally parallel to each other in a first direction x and a second direction y perpendicular to the first direction x, and having a respective z-height measurement in a third direction perpendicular to the first direction and the second direction;

wherein, when the package is coupled to the substrate, the hanging die is positioned within all or part of the substrate recess; and wherein at least part of the hanging die is tangent to the substrate.

2. The package of claim 1, wherein a second die is molded into the package.

3. The package of claim 1, wherein the hanging die is electrically coupled to and parallel to the active side plane of the package.

4. The package of claim 3, wherein the hanging die is a combination of multiple hanging dies.

5. The package of claim 1, wherein a material to dissipate heat directly connects at least part of the hanging die portion positioned within all or part of the substrate recess to at least part of the substrate.

6. The package of claim 5, wherein a heat spreader is attached to an opposite substrate side; and wherein the heat spreader is directly connected to the material to dissipate heat.

7. The package of claim 5, wherein the material to dissipate heat is one or more of a heat conductive paste, a gap pad, a heat spreader nose, or printed solder paste.

8. The package of claim 5, wherein the material to dissipate heat further includes an intermetallic compound.

9. The package of claim 1, wherein the substrate is a PCB, and the recess in the substrate is a PCB cutout.

10. The package of claim 1, wherein the hanging die is connected to the substrate with underfill material.

11. A system with a package assembly, the system comprising:

a printed circuit board, PCB, comprising:

an active side plane;

a connection area on the active side plane to electrically couple with a package assembly; and a recess within the connection area having dimensions sufficient for a hanging die of the package assembly to fit into when the package assembly is attached to the PCB; and a package assembly coupled with the PCB, the package assembly comprising:

a hanging die coupled to an active side plane of the package assembly, wherein, when the package assembly is coupled to the substrate, the hanging die is positioned within all or part of the PCB recess; and wherein at least part of the hanging die is tangent to the PCB.

12. The system of claim 11, wherein the PCB further includes:

a thermally conductive material in contact with the hanging die and the PCB.

13. The system of claim 11, wherein the PCB further includes;

a heat spreader that is connected to a backside of the PCB that is not the active side plane;

a thermally conductive material that connects the hanging die to the heat spreader.

14. The system of claim 11, wherein the PCB further includes one or more thermally conductive metallic layers connected to the hanging die using thermally conductive material.

15. The system of claim 11, wherein the thermally conductive material is a gap pad, heat dissipation paste, or printed solder paste.

* * * * *